(12) United States Patent
Choi et al.

(10) Patent No.: US 7,612,359 B2
(45) Date of Patent: Nov. 3, 2009

(54) MICROELECTRONIC DEVICES USING SACRIFICIAL LAYERS AND STRUCTURES FABRICATED BY SAME

(75) Inventors: Suk-Hun Choi, Gyeonggi-do (KR); Yoon-Ho Son, Gyeonggi-do (KR); Sung-Lae Cho, Gyeonggi-do (KR); Joon-Sang Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 105 days.

(21) Appl. No.: 11/860,674

(22) Filed: Sep. 25, 2007

(65) Prior Publication Data

US 2008/0011999 A1   Jan. 17, 2008

Related U.S. Application Data

(62) Division of application No. 10/873,388, filed on Jun. 22, 2004, now Pat. No. 7,291,556.

(30) Foreign Application Priority Data

Dec. 12, 2003  (KR) ............................... 2003-90874
Apr. 1, 2004   (KR) ............................... 2004-22720

(51) Int. Cl.
*H01L 29/02* (2006.01)

(52) U.S. Cl. ............ 257/2; 257/3; 257/4; 257/E31.029; 365/148

(58) Field of Classification Search ................ 257/1–8, 257/45, E31.029; 365/148
See application file for complete search history.

(56) References Cited

U.S. PATENT DOCUMENTS 3,877,049 A    4/1975   Buckley (Continued)

FOREIGN PATENT DOCUMENTS

JP       63272037 A    11/1988

(Continued)

OTHER PUBLICATIONS

Park et al, Study of Over-Polishing at the Edge of a Pattern in Selective CMP, Sixth International Symposium on Chemical Mechanical Polishing, 204th Meeting of the Electrochemical Society, Inc., Oct. 12-16, 2003, 8 pages.

(Continued)

*Primary Examiner*—Evan Pert
*Assistant Examiner*—Scott R Wilson
(74) *Attorney, Agent, or Firm*—Myers Bigel Sibley & Sajovec

(57) ABSTRACT

A dielectric layer is formed on a region of a microelectronic substrate. A sacrificial layer is formed on the dielectric layer, and portions of the sacrificial layer and the dielectric layer are removed to form an opening that exposes a portion of the region. A conductive layer is formed on the sacrificial layer and in the opening. Portions of the sacrificial layer and the conductive layer on the dielectric layer are removed to leave a conductive plug in the dielectric layer and in contact with the region. Removal of the sacrificial layer and portions of the conductive layer on the dielectric layer may include polishing to expose the sacrificial layer and to leave a conductive plug in the sacrificial layer and the dielectric layer, etching the sacrificial layer to expose the dielectric layer and leave a portion of the conductive plug protruding from the dielectric layer, and polishing to remove the protruding portion of the conductive plug. Phase-change memory devices formed by such techniques are also discussed.

12 Claims, 10 Drawing Sheets

U.S. PATENT DOCUMENTS

| | | | |
|---|---|---|---|
| 5,244,534 A | | 9/1993 | Yu et al. |
| 5,440,167 A | | 8/1995 | Iranmanesh |
| 5,776,833 A | | 7/1998 | Chen et al. |
| 5,789,758 A | | 8/1998 | Reinberg |
| 5,970,336 A | | 10/1999 | Wolstenholme et al. |
| 6,117,720 A | | 9/2000 | Harshfield |
| 6,147,395 A | * | 11/2000 | Gilgen ............... 257/529 |
| 6,274,485 B1 | * | 8/2001 | Chen et al. ........... 438/652 |
| 6,613,604 B2 | | 9/2003 | Maimon et al. |
| 6,806,528 B2 | * | 10/2004 | Lee et al. ............ 257/296 |
| 6,833,331 B2 | | 12/2004 | Saito et al. |
| 6,884,735 B1 | * | 4/2005 | Okoroanyanwu et al. ... 438/725 |
| 6,972,262 B2 | | 12/2005 | Lee et al. |
| 7,037,762 B2 | * | 5/2006 | Joo et al. ............ 438/128 |
| 7,071,485 B2 | * | 7/2006 | Takaura et al. ........ 257/3 |
| 2001/0004066 A1 | * | 6/2001 | Toshima et al. ....... 216/13 |

FOREIGN PATENT DOCUMENTS

| | | |
|---|---|---|
| JP | 2000-260768 | 9/2000 |
| JP | 2003-174144 | 6/2003 |
| KR | 1019980011873 | 4/1998 |
| KR | 1020040017740 A | 2/2004 |
| KR | 1020040038422 A | 5/2004 |

OTHER PUBLICATIONS

Hwang et al, "Completely CMOS-Compatible Phase-Change Nonvolatile Ram Using NMOS Cell Transistors," Non-Volatile Semiconductor Memory Workshop, Feb. 2003, pp. 91-92.

Hwang et al, "Phase Change Chalcogenide Nonvolatile RAM Completely Based on CMOS Technology," VLSI Symposium, Jun. 2003, 3 pages.

Park et al., "Study of Over-polishing at the Edge of a Pattern in Selective CMP," Abs. 930, 204$^{th}$ Meeting of the Electrochemical Society, Inc., Oct. 12-16, 2003, 1 page.

* cited by examiner

MICROELECTRONIC DEVICES USING SACRIFICIAL LAYERS AND STRUCTURES FABRICATED BY SAME

REFERENCE TO PRIORITY APPLICATIONS

This application is a divisional of U.S. application Ser. No. 10/873,388, filed Jun. 22, 2004, now U.S. Pat. No. 7,291,556 which claims priority to Korean Application Nos. 2003-90874 and 2004-22720, filed on Dec. 12, 2003 and Apr. 1, 2004, respectively, in the Korean Intellectual Property Office, the disclosures of which are incorporated herein in their entirety by reference.

BACKGROUND OF THE INVENTION

The present invention relates to integrated circuit fabrication techniques, and more particularly, to techniques for fabricating small features, such as contacts, in integrated circuit devices, such as phase-change memory devices.

Factors, such as an ongoing desire for increased circuit integration and the development of new device configurations (e.g., new memory cell types) that are scaleable to extremely small dimensions, have led to an increasing need for techniques for fabricating very small features in integrated circuit devices. Lower bounds on feature size often arise from constraints of photolithography, i.e., the resolution to which layers can be patterned and properly aligned may constrain the size of features that can be fabricated. Techniques, such as the use of sidewall spacers to reduce patterned dimensions of objects like holes in material layers and the use of creative etching techniques, have been developed to lessen some of these constraints, but other barriers to reliably and repeatably forming small structures still remain.

Damascene processes are commonly used in integrated circuit processing to form features such as contacts and wiring patterns. For example, in a typical conventional damascene process, a silicon dioxide layer is formed on a microelectronic substrate. A groove (for wiring) and/or an opening to an underlying region (for a contact) is formed in the dielectric layer. A conductive layer (e.g., a metal containing layer) is then deposited on the dielectric layer, filling the groove and/or opening. Chemical mechanical polishing (CMP) may then be used to remove portions of the conductive layer disposed on the dielectric layer, thus leaving a wiring pattern in the groove and/or a contact plug in the opening.

Such techniques may be used, for example, in fabricating a lower electrode contact (or "small contact") that provides a high current density path for heating a phase-changeable material (e.g., chalcogenide) region in a phase-change memory device. In a typical fabrication process for such a cell, a dielectric layer is formed over a conductive plug or pad that is electrically coupled to a source/drain region of an access transistor formed on a semiconductor substrate, and a small contact hole is made in the dielectric layer to expose an upper surface of the plug or pad. A metal-containing material is then deposited on the dielectric layer and in the small contact hole. Excess material disposed on the dielectric layer is then removed using CMP to leave a small contact plug in the contact hole. A phase-changeable material region is then formed on the surface of the dielectric layer and the small contact plug, and an upper electrode is formed on the phase-changeable material region. Examples of techniques for forming contacts for phase-change memory devices are described in U.S. Pat. No. 6,117,720 and U.S. Pat. No. 6,147,395.

Conventional processes may have characteristics that can limit the ability to reliably and repeatably make small contacts or other small structures. In particular, in many applications, it may be desirable to remove a metal or other conductive layer as close as possible to the top of a surrounding dielectric layer or region. For example, in forming small contact plugs for phase-change memory cells along the lines described above, it is generally desirable to remove the metal layer down to a shoulder of the opening in the dielectric layer so that the surface area of the individual contact plugs is made as small as possible while maintaining the planarity of the substrate surface and uniformity among the contact plugs. However, using a conventional process as described above can result in less than desirable results due to flaring at the mouths of the contact holes and/or dishing, overerosion, edge over-erosion, and other surface non-uniformity arising from the CMP. Such effects may be exacerbated by variation in pattern density across the surface of the wafer.

SUMMARY OF THE INVENTION

According to some embodiments of the present invention, a contact for a region of a microelectronic substrate is formed. A dielectric layer is formed on the region. A sacrificial layer is formed on the dielectric layer. Portions of the sacrificial layer and the dielectric layer are removed to form an opening that exposes a portion of the region. A conductive layer is formed on the sacrificial layer and in the opening. The substrate is polished to expose the sacrificial layer and to leave a conductive plug in the sacrificial layer and the dielectric layer. The sacrificial layer is etched to expose the dielectric layer and leave a portion of the conductive plug protruding from the dielectric layer. The substrate is again polished to remove the protruding portion of the conductive plug and thereby form the contact. In some embodiments, the sacrificial layer includes silicon dioxide, the dielectric layer includes silicon nitride and/or silicon oxynitride, and the conductive layer includes a metal-containing layer, such as a tungsten layer. A polymer residue on the substrate may be ashed after the first polishing step and/or the second polishing step, and the ashed polymer residue may be removed with a cleaning solution, e.g., hydrofluoric acid.

In further embodiments, a photoresist layer is formed on the sacrificial layer and patterned to form an opening that exposes a portion of the sacrificial layer. The patterned photoresist layer is reflowed to narrow the opening. The sacrificial layer and the dielectric layer are etched using the reflowed photoresist layer as an etching mask to form an opening that exposes a portion of the region. This may be followed by forming a sidewall spacer that narrows the opening, and forming a conductive layer that fills the narrowed opening. The reflow step or the formation of the sidewall spacer may be omitted in some embodiments.

According to additional embodiments of the present invention, a dielectric layer is formed on a region of a microelectronic substrate. A sacrificial layer is formed on the dielectric layer, and portions of the sacrificial layer and the dielectric layer are removed to form an opening that exposes a portion of the region. A conductive layer is formed on the sacrificial layer and in the opening. Portions of the sacrificial layer and the conductive layer on the dielectric layer are removed to leave a conductive plug in the dielectric layer and in contact with the region. Removal of the sacrificial layer and portions of the conductive layer on the dielectric layer may include polishing to expose the sacrificial layer and to leave a conductive plug in the sacrificial layer and the dielectric layer, etching the sacrificial layer to expose the dielectric layer and leave a portion of the conductive plug protruding from the dielectric layer, and polishing to remove the protruding portion of the conductive plug.

In further embodiments of the present invention, a method of fabricating a microelectronic structure includes forming a dielectric layer on a substrate and forming a sacrificial layer having an etching selectivity with respect to the dielectric layer on the dielectric layer. An opening is formed that extends through the sacrificial layer and at least partially into the dielectric layer. A conductive material, e.g., a metal or metal-containing material, is deposited on the sacrificial layer and into the opening. The substrate is polished to expose the sacrificial layer and leave a conductive region in the sacrificial layer and the dielectric layer. The sacrificial layer is etched to expose the dielectric layer and leave a portion of the conductive region protruding therefrom. The substrate is again polished to remove the protruding portion of the conductive region.

According to some embodiments of the present invention, a phase-change memory element is fabricated. A first conductive region is formed on a microelectronic substrate. A dielectric layer is formed on the first conductive region, and a sacrificial layer is formed on the dielectric layer. Portions of the sacrificial layer and the dielectric layer are removed to form an opening that exposes a portion of the first conductive region, and a conductive layer is formed on the sacrificial layer that extends through the opening to contact the first conductive region. The sacrificial layer and portions of the conductive layer are removed to leave a conductive plug in the dielectric layer and in contact with the first conductive region. A phase changeable material region is formed on the conductive plug, and a second conductive region is formed on the phase changeable material region. Removal of the sacrificial layer and portions of the conductive layer may include polishing to expose the sacrificial layer and leave a conductive plug in the sacrificial layer and the dielectric layer, etching the sacrificial layer to expose the dielectric layer and leave a portion of the conductive plug protruding from the dielectric layer, and polishing to remove the protruding portion of the plug. The sacrificial layer may include silicon dioxide, the dielectric layer may include silicon nitride and/or silicon oxynitride, and the conductive layer may include a metal-containing layer.

In some embodiments, a photoresist layer is formed on the sacrificial layer and patterned to form an opening that exposes a portion of the sacrificial layer. The photoresist layer is reflowed to narrow the opening, and the sacrificial layer and the dielectric layer are etched using the reflowed photoresist layer as an etching mask to form an opening that exposes a portion of the first conductive region. A sidewall spacer that narrows the opening may be formed, and the conductive layer may include a conductive layer that fills the narrowed opening.

According to further embodiments of the present invention, a phase-change memory device includes a microelectronic substrate including a first conductive region, a silicon nitride layer and/or a silicon oxynitride layer on the first conductive region, a contact plug extending from a surface of the silicon nitride layer and/or a silicon oxynitride layer through an opening therein to the first conductive region, a phase changeable material region on the contact plug and the silicon nitride layer and/or a silicon oxynitride layer, and a second conductive region on the phase changeable material region. The device may further include a sidewall spacer in the opening in the silicon nitride layer and/or a silicon oxynitride layer.

DETAILED DESCRIPTION OF EXEMPLARY EMBODIMENTS

Figure 1:
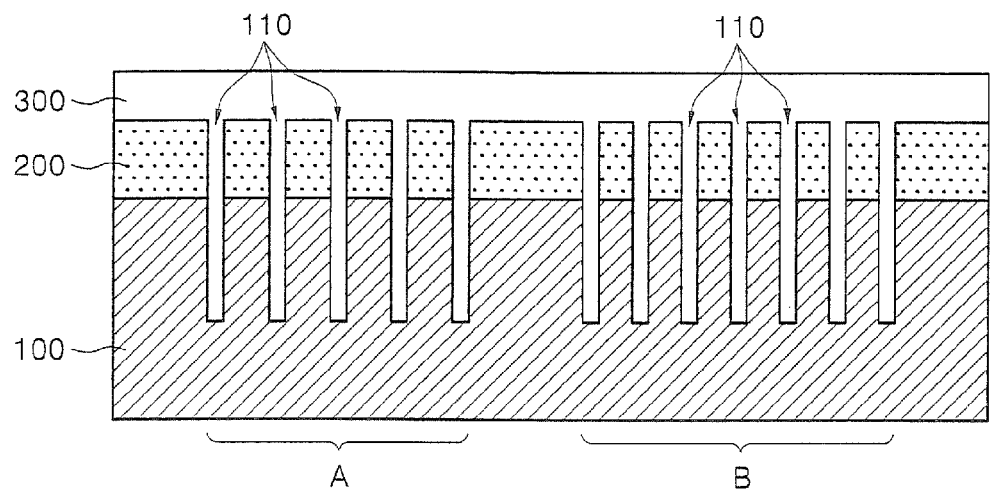
FIGS. 1-4 are cross-sectional views illustrating exemplary operations of a multi-CMP process for forming structures in a dielectric layer according to some embodiments of the present invention.

The present invention now will be described more fully hereinafter with reference to the accompanying drawings, in which typical and exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the thickness of layers and regions are exaggerated for clarity. It will be understood that when an element such as a layer, region or substrate is referred to as being "on" another element, it can be directly on the other element or intervening elements may also be present. Furthermore, relative terms, such as "beneath," may be used herein to describe one element's relationship to another elements as illustrated in the drawings. It will be understood that relative terms are intended to encompass different orientations of the device in addition to the orientation depicted in the drawings. For example, if the device in the drawings is turned over, elements described as "below" other elements would then be oriented "above" the other elements. The exemplary term "below," therefore, encompasses both an orientation of above and below.

It will be understood that although the terms "first" and "second" are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second without departing from the teachings of the present invention. As used herein the term "and/or" includes any and all combinations of one or more of the associated listed items. Like numbers refer to like elements throughout.

FIGS. 1-4 illustrate exemplary operations for forming conductive structures, such as wiring and/or contacts, in a microelectronic substrate according to some embodiments of the present invention. Referring to FIG. 1, a dielectric layer 100 and a sacrificial layer 200 are formed on a substrate (not shown), and openings 110 formed therein in low density and high density pattern regions A, B. The sacrificial layer 200 includes a material that exhibits an etching selectivity with respect to the dielectric layer 100 in a subsequent etching process described below. For example, the dielectric layer 100 may include silicon nitride and/or silicon oxynitride, and the sacrificial layer may include silicon dioxide. It will be appreciated that the layers 100, 200 may be single layers or compound layers including multiple layers. The openings 110 may be formed using any of a number of different conventional techniques, such as by etching using a photolithographic mask. It will be understood that the openings formed in the layers 100, 200 may extend only partially into the dielectric layer 100, as might be the case in forming a wiring pattern, for example, and/or may extend through the dielectric layer 100 (as shown in dashed line) to expose an underlying structure, as might be the case in forming a contact for that underlying structure.

As further shown in FIG. 1, a conductive layer 300 is formed on the sacrificial layer 100, filling the openings 110. In general, the conductive layer 300 may include any of a number of different materials, including, but not limited to, metals, such as aluminum, titanium, copper, and tungsten, and/or metal-containing materials, such as metal suicides or metal nitrides, and/or non-metallic conductors, such as polysilicon. The conductive layer 300 may comprise a single layer or compound layers including, for example, ohmic transition layers, glue layers, contamination barrier layers, spacers, and the like.

Figure 2:
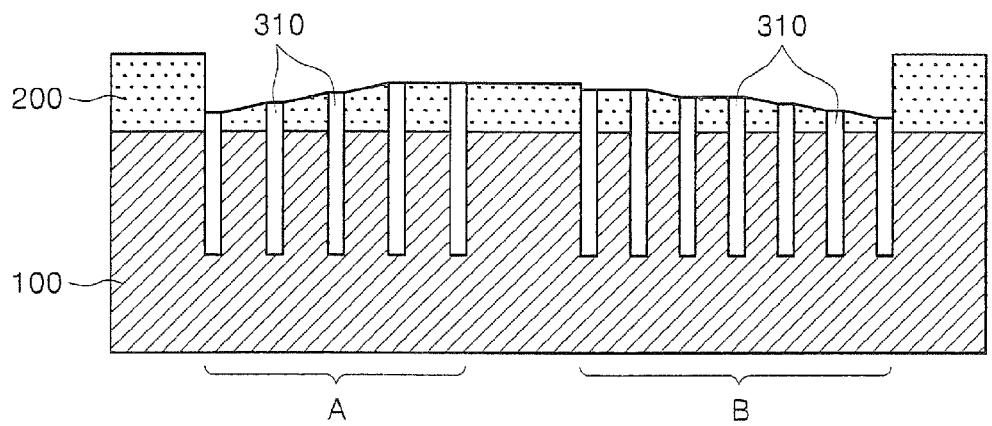

Referring to FIG. 2, a first CMP is performed to remove portions of the metal-containing layer 300 on the sacrificial layer 200 and leave conductive regions 310 in the sacrificial layer 200 and the dielectric layer 100. As shown, the CMP may erode portions of the sacrificial layer 200, and the conductive regions 310 may be significantly non-uniform in extent.

Figure 3:
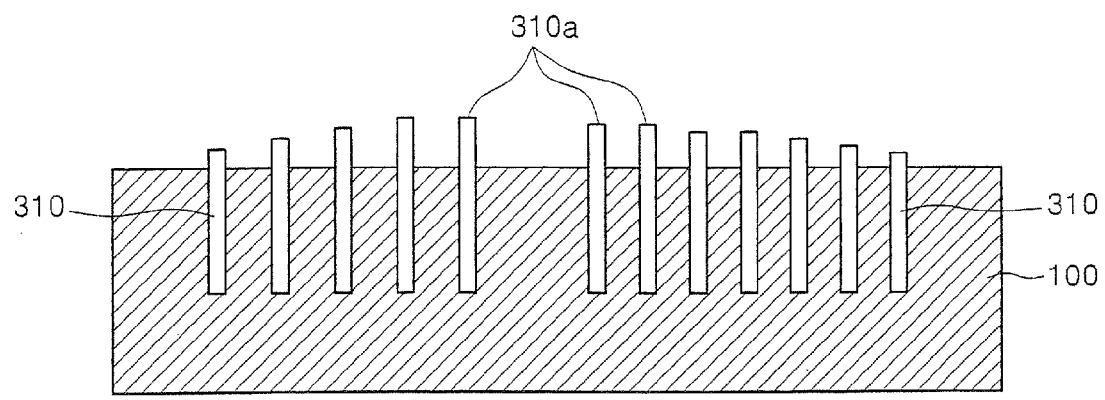

Referring to FIG. 3, the sacrificial layer 200 is etched (e.g., dry or wet etched) away to expose the dielectric layer 100, leaving portions 310a of the conductive regions 310 protruding from the dielectric layer. An ashing process using an oxygen plasma and subsequent cleaning using, for example, a dilute HF solution, may be performed after this etching to remove polymer residues that may remain on the dielectric layer 100. Such residues may have their source in particles left on the substrate by polymer polishing pads used in the preceding CMP.

Figure 4:
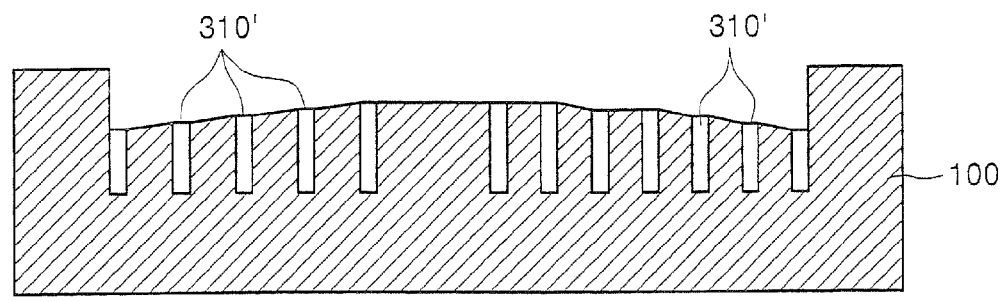

Referring to FIG. 4, a second CMP is performed to remove the protruding portions 310a of the conductive regions 310, leaving reduced-size conductive regions 310' in the dielectric layer 100. As shown, some erosion of the dielectric layer 100 and non-uniformity in the conductive regions 310' may occur as a result of this second CMP. However, it is believed that, because the second CMP process can be highly selective of the exposed protruding portions 310a of the conductive regions 310, the degree of erosion of dielectric layer 100 can be limited to an acceptable level. Accordingly, the size of the conductive regions 310' may be more uniform using the above-described process, which includes two CMP processes and an intervening etching process, in comparison to a conventional single-CMP approach. To prepare the resulting structure for further fabrication operations, for example, formation of one or more chalcogenide regions on the conductive regions 310' as would be done in fabricating a phase-change memory device, polymer residues may be removed by an oxygen plasma ashing process and a subsequent cleaning using, for example, an HF solution.

FIGS. 5-12 illustrate additional aspects of the present invention, showing how a multiple-CMP process with intermediate etching of a sacrificial layer along the lines described above may be particularly advantageous in forming a very small structure, such as a small contact for a phase-change memory device, and how use of a sacrificial layer, such as a sacrificial layer used in the multi-CMP procedure described, can allow a desirably narrow contact to be formed. In particular, FIGS. 5-12 illustrate a phase-change memory device and fabrication operations therefor that include two CMP operations with an intermediate etching operation along the lines described above according to further embodiments of the present invention. It will be appreciated that, although the fabrication operations and structures formed thereby illustrated in FIGS. 5-12 illustrate how a fabrication process such as that described above with reference to FIGS. 1-4 may be particularly advantageous for forming a phase-change memory device, the embodiments of FIGS. 5-12 are provided for purposes of illustration, and the present invention is not limited to such embodiments.

Figure 5:
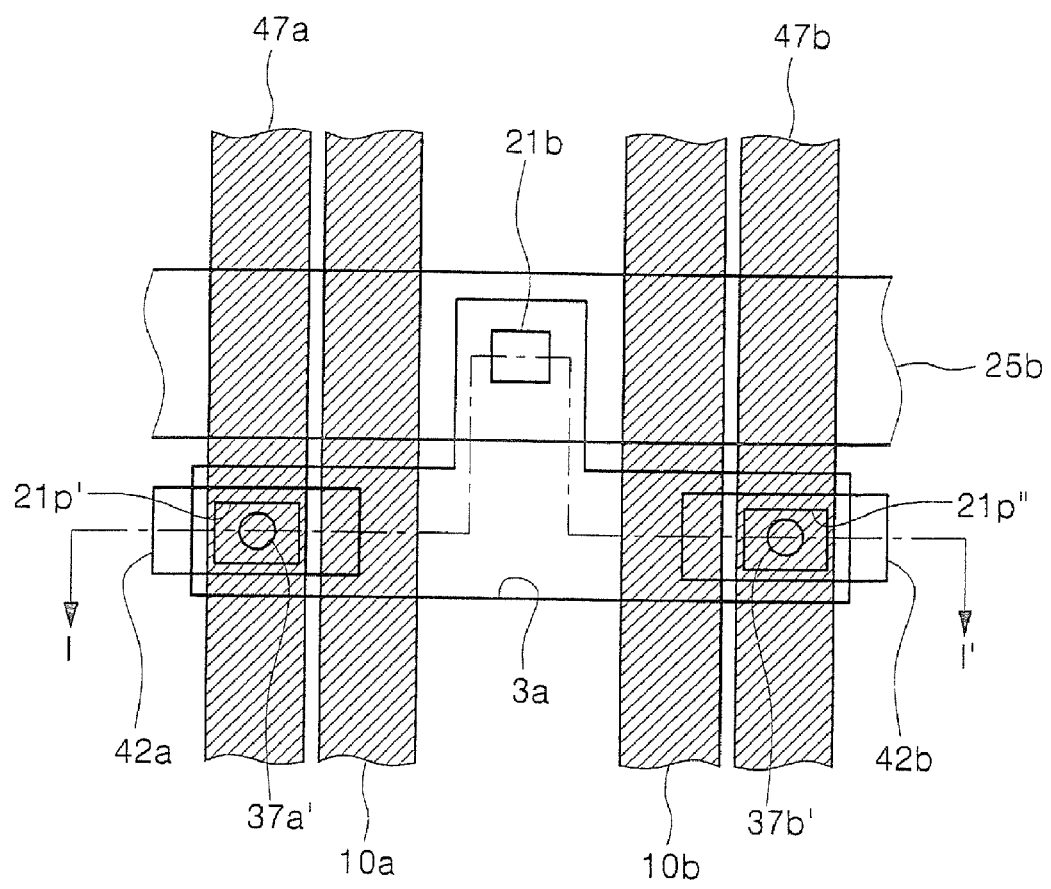
FIGS. 5 and 6 are plan and cross-sectional views, respectively, of a phase-change memory device according to some embodiments of the present invention.
Figure 6:
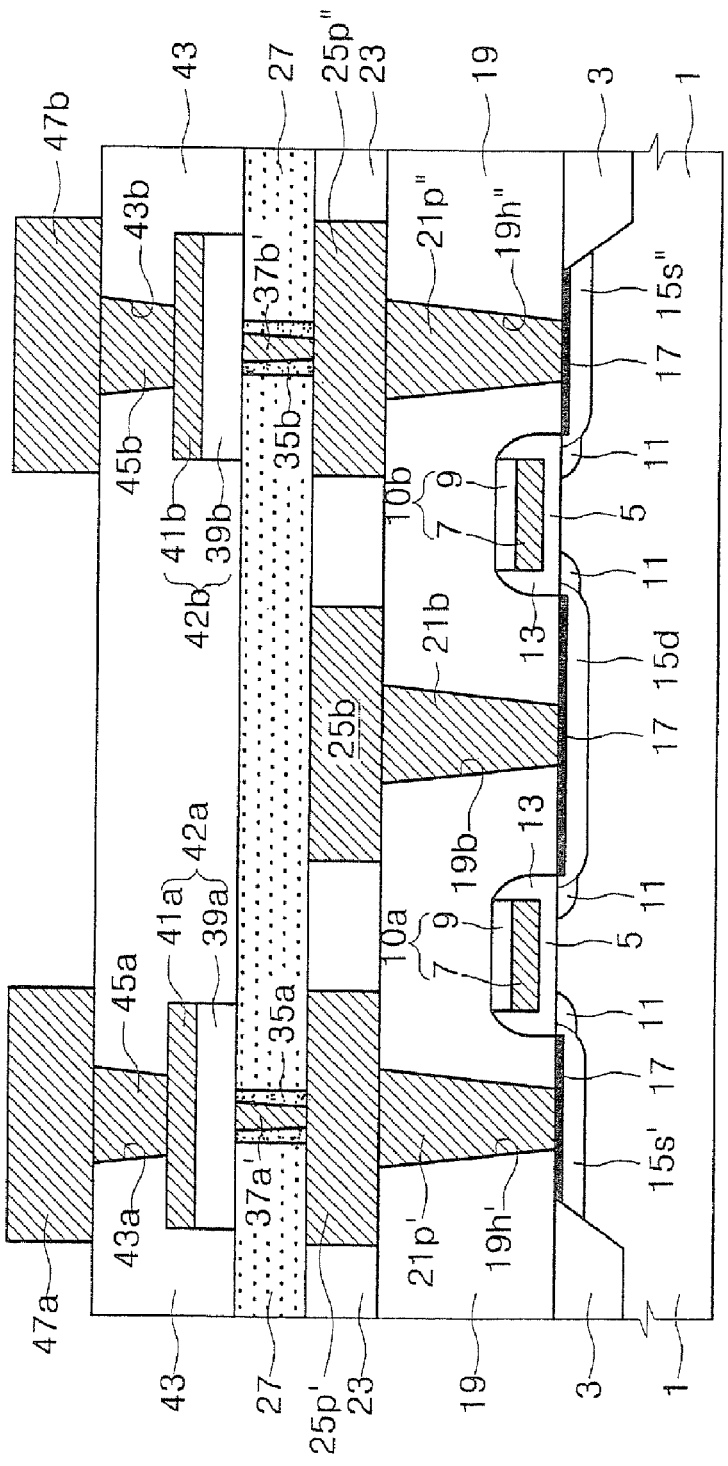

FIGS. 5 and 6 are a plan view and a cross-sectional view, respectively, of a phase-change memory device according to some embodiments of the present invention, with the cross-sectional view of FIG. 6 corresponding to a section taken along a line I-I' shown in FIG. 5. The device includes a semiconductor substrate 1 in which source/drain regions 15s', 15d, 15s'' are formed between isolation regions 3 in the substrate 1. As shown, the source/drain regions 15s', 15d, 15s'' include lightly doped regions 11 and have respective metal silicide layers 17 formed thereon. Gate structures 10a, 10b are disposed between respective pairs of the source/drain regions 15s', 15d, 15s'' and include a gate insulation layer 5, a gate electrode layer 7, a capping layer 9 and sidewall spacers 13.

A first interlayer dielectric layer 19 is disposed on the substrate 1. Conductive plugs 21p', 21b, 21p'' pass through openings 19h', 19b, 19h'' in the first interlayer dielectric 19, contacting the metal silicide layers 17 on respective ones of the source/drain regions 15s', 15d, 15s''. A second interlayer dielectric layer 23 is disposed on the first interlayer dielectric 19, and conductive pads 25p', 25p'' and a bit line 25b therein contact respective ones of the conductive plugs 21p', 21p'', 21b.

A third dielectric layer 27 is disposed on the second dielectric layer 23. Conductive small contact plugs 37a', 37b pass through the third dielectric layer 23 and contact respective ones of the conductive pads 25p', 25p'' through openings having sidewall spacers 35a, 35b therein. Phase-changeable (e.g., chalcogenide) material regions 39a, 39b are disposed on respective ones of the small contact plugs 35a, 35b, and upper electrodes 41a, 41b are disposed on respective ones of the phase-changeable material regions 39a, 39b. The phase-changeable material regions 39a, 39b and the upper electrodes 41a, 41b are surrounded by another interlayer dielectric layer 43. Conductive contact plugs 45a, 45b contact respective ones of the upper electrodes 41a, 41b through respective openings 43a, 43b in the interlayer dielectric layer 43. Respective plate lines 47a, 47b are disposed on respective ones of the contact plugs 45a, 45b. It will be appreciated that the gate structures 10a, 10b and the source/drain regions 15s', 15d, 15s'' form respective transistors that can be used to control current flow through the respective phase-changeable material regions 39a, 39b, which serve as information storage elements.

Figure 7:
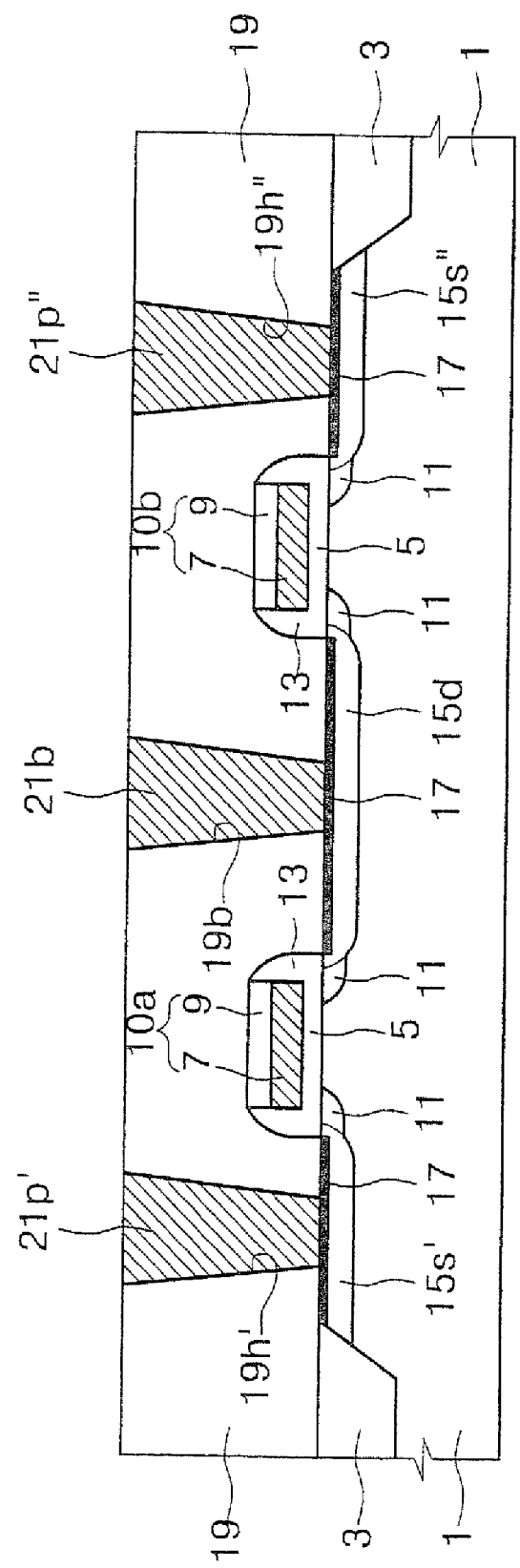
FIGS. 7-12 are cross-sectional views of intermediate fabrication products illustrating exemplary operations for forming the device of FIGS. 5 and 6 according to further embodiments of the present invention.
Figure 8:
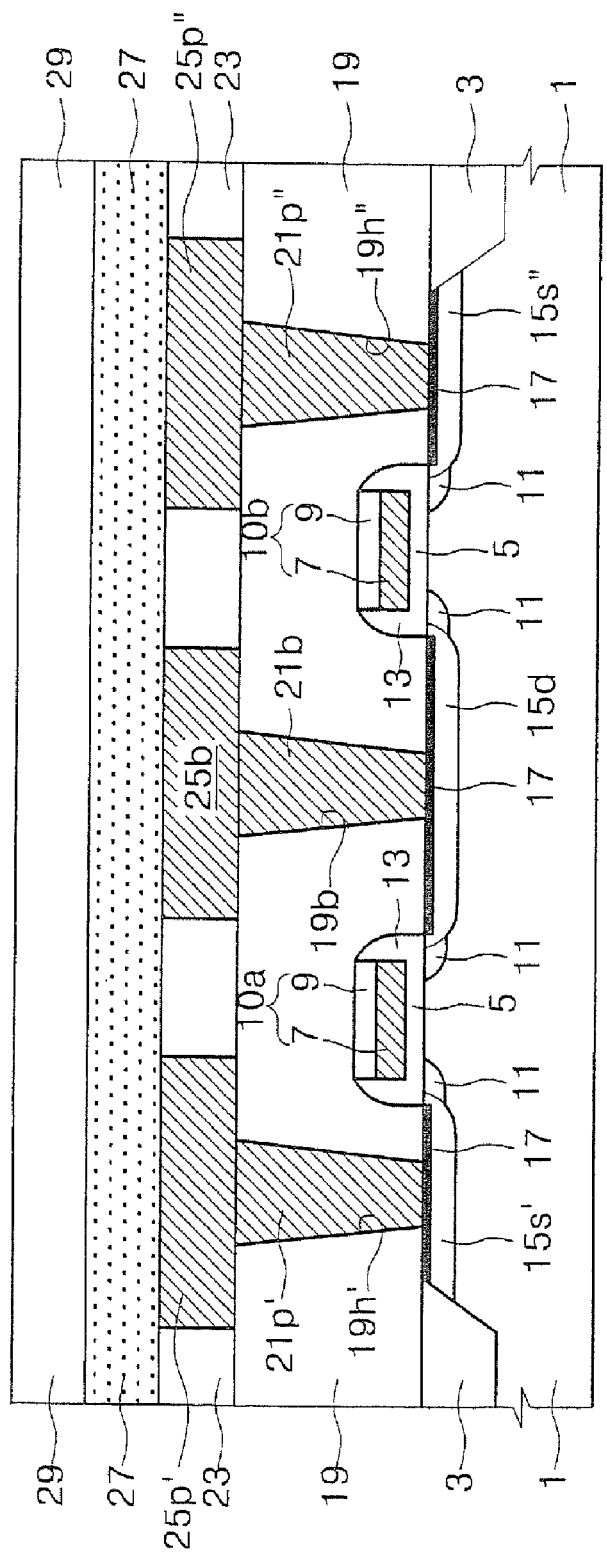

Exemplary operations for fabricating the device illustrated in FIGS. 5 and 6 will now be explained with reference to FIGS. 7-12. Referring to FIG. 7, isolation regions 3 are formed in the semiconductor substrate 1 to define an active region. Such isolation regions may be, for example, conventionally formed trench and/or field oxide regions. Spaced-apart gate structures 10a, 10b may be formed on the substrate 1 in a conventional manner, and include a gate insulation (e.g., silicon oxide) layer 5, a conductive (e.g., polysilicon and/or metal) gate electrode layer 7, an insulating (e.g., silicon oxide, silicon nitride and/or silicon oxynitride) capping layer 9 and insulating (e.g., silicon oxide, silicon nitride and/or silicon oxynitride) sidewall spacers 13. The source/drain regions 15s', 15p, 15s" (including the lightly doped regions 11) may also be formed in a conventional fashion, e.g., by impurity ion implantations using various parts of the gate structures 10a, 10b as masks. The metal silicide layers 17, the interlayer dielectric layer 19 and the contact plugs 21p', 21b, and 21p" may also be formed conventionally. Referring to FIG. 8, the dielectric layer 23 may be formed using, for example, conventional deposition techniques, and the contact pads 25p', 25p" and bit line 25 may be formed using, for example, conventional patterning, deposition, and planarization techniques.

A dielectric layer 27 and a sacrificial layer 29 are sequentially formed on the dielectric layer 23. The dielectric layer 27 preferably is a material that is more etch-resistant than the sacrificial layer 29 in a subsequent intermediate etching process described in detail below. Also, it is preferable that the dielectric layer 27 be a material of sufficient resistance to erosion in a CMP process that is performed after the etching. For example, the dielectric layer 27 may be a silicon nitride and/or silicon oxynitride layer, and the sacrificial layer 29 may be a silicon dioxide layer. It will be appreciated, however, that other combinations of materials be used for the dielectric and sacrificial layers 27, 29.

Figure 9:
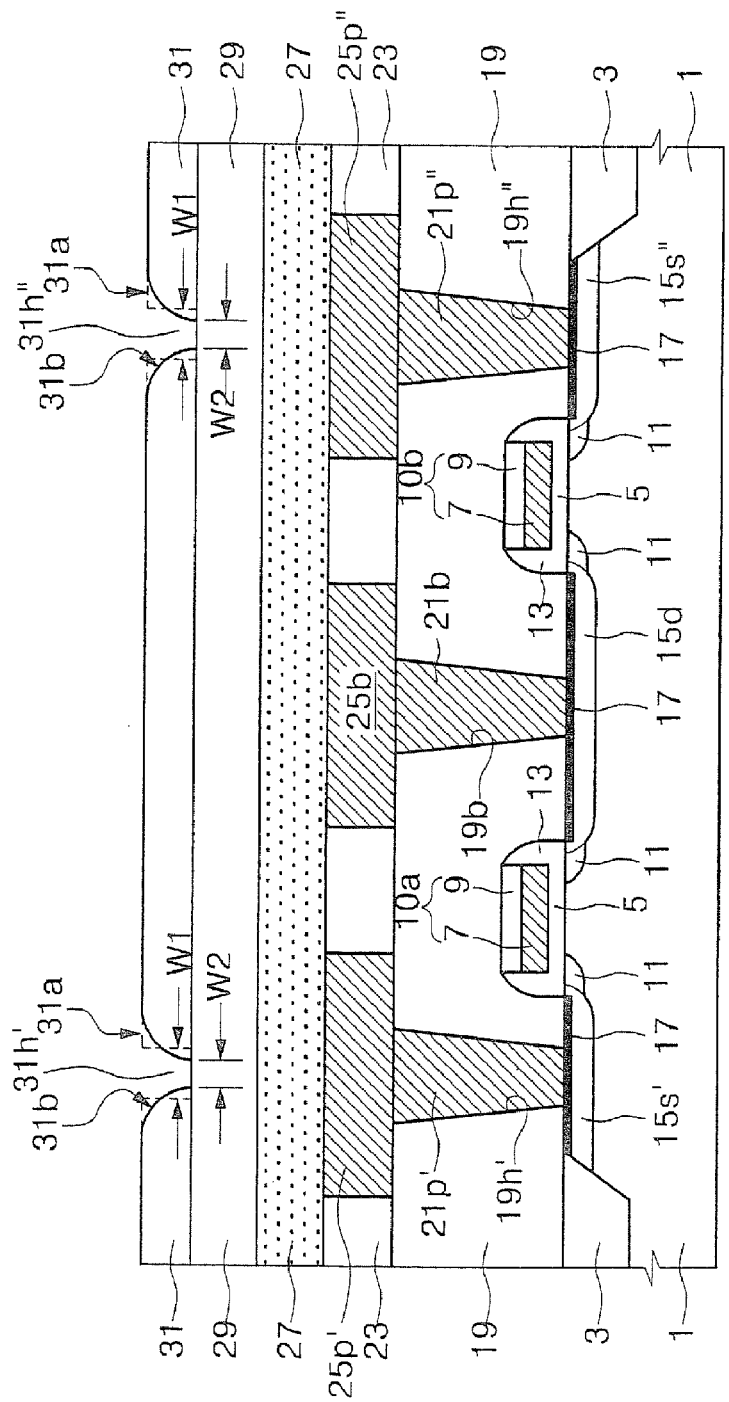

Referring to FIG. 9, a photoresist layer is formed on the sacrificial layer 29, and patterned to form a mask 31 with openings 31h', 31h" therein that expose underlying portions of the sacrificial layer 29. As shown in FIG. 9, the patterned photoresist layer 31 may be reflowed (e.g., at about 250° C. to about 350° C.) to reduce the width of the openings 31h', 31h" from a first width W1 to a second width W2 by rounding shoulder portions 31a, 31b of the pattern 31.

Figure 10:
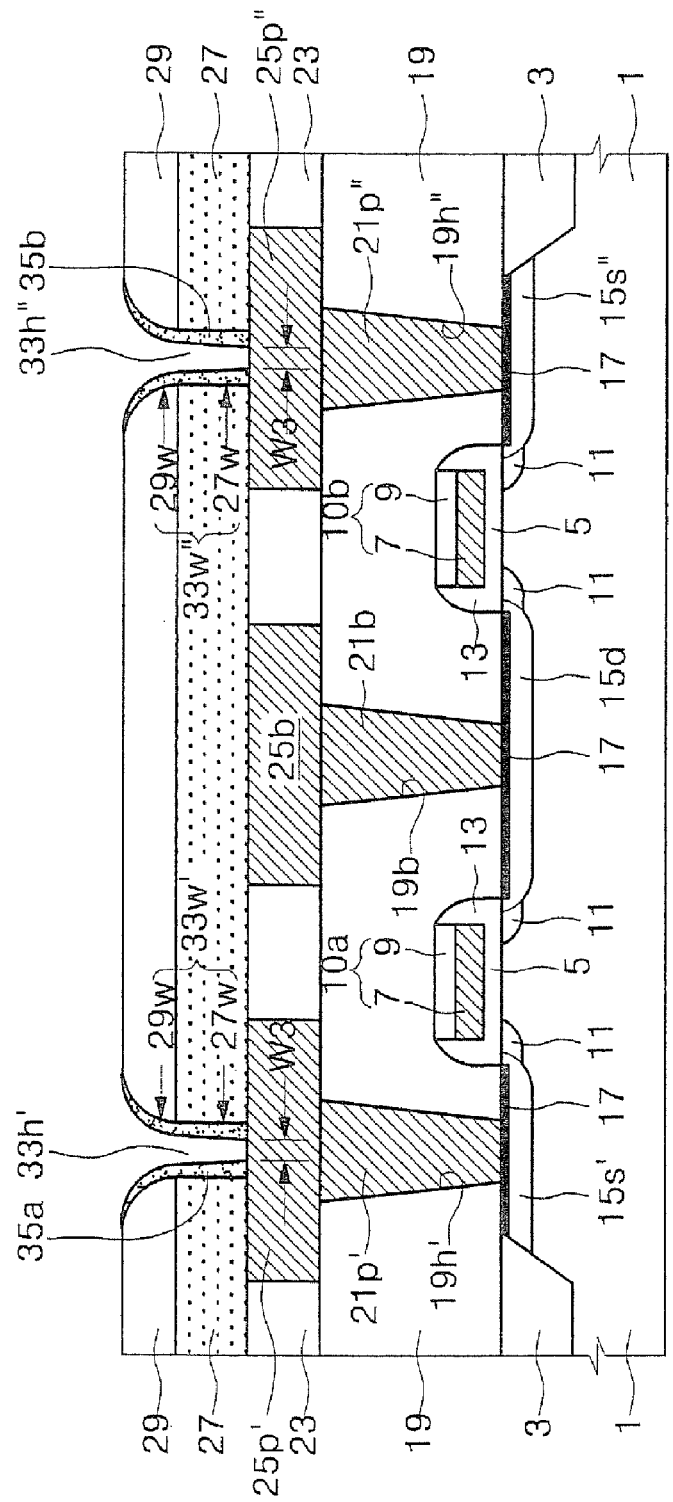

As illustrated by FIG. 10, the sacrificial layer 29 and the dielectric layer 27 are etched using the photoresist pattern 31 as a mask, exposing top portions of the pads 25p', 25p" through openings 33h', 33h". Sidewall spacers 35a, 35b may be formed on sidewalls 33w', 33w" of the openings 33h', 33h" by removing the photoresist pattern 31, depositing, for example, silicon nitride and/or silicon oxynitride on the sacrificial layer 27 and into the openings 33h', 33h", and etching to remove portions of the deposited material from the surface of the sacrificial layer 29 and the bottom of the openings 33h', 33h". As the spacers 35a, 35b serve to further narrow the openings 33h', 33h", the previously described reflowing of the photoresist pattern 31 may be omitted if the spacers 35a, 35 produce sufficiently narrow openings. Similarly, formation of the spacers 35a, 35b may be omitted if the reflow of the photoresist provides sufficient narrowing. In some embodiments, both operations may be performed.

As also shown in FIG. 10, the use of two layers 27, 29 results in the sidewalls 33w', 33w" of the holes 33h', 33h" including sidewalls 27w, 29w of the dielectric layer 27 and the sacrificial layer 29, respectively. The openings 33h', 33h" are generally flared, with a greater amount of flaring being present near the tops of the openings 33h', 33h" in the sidewalls 29w of the sacrificial layer 29. The maximum width W3 of the openings 33h', 33h" at the sidewalls 27w of the dielectric layer 27 is generally less than the maximum width at the sidewalls 29w of the sacrificial layer 29.

Figure 11:
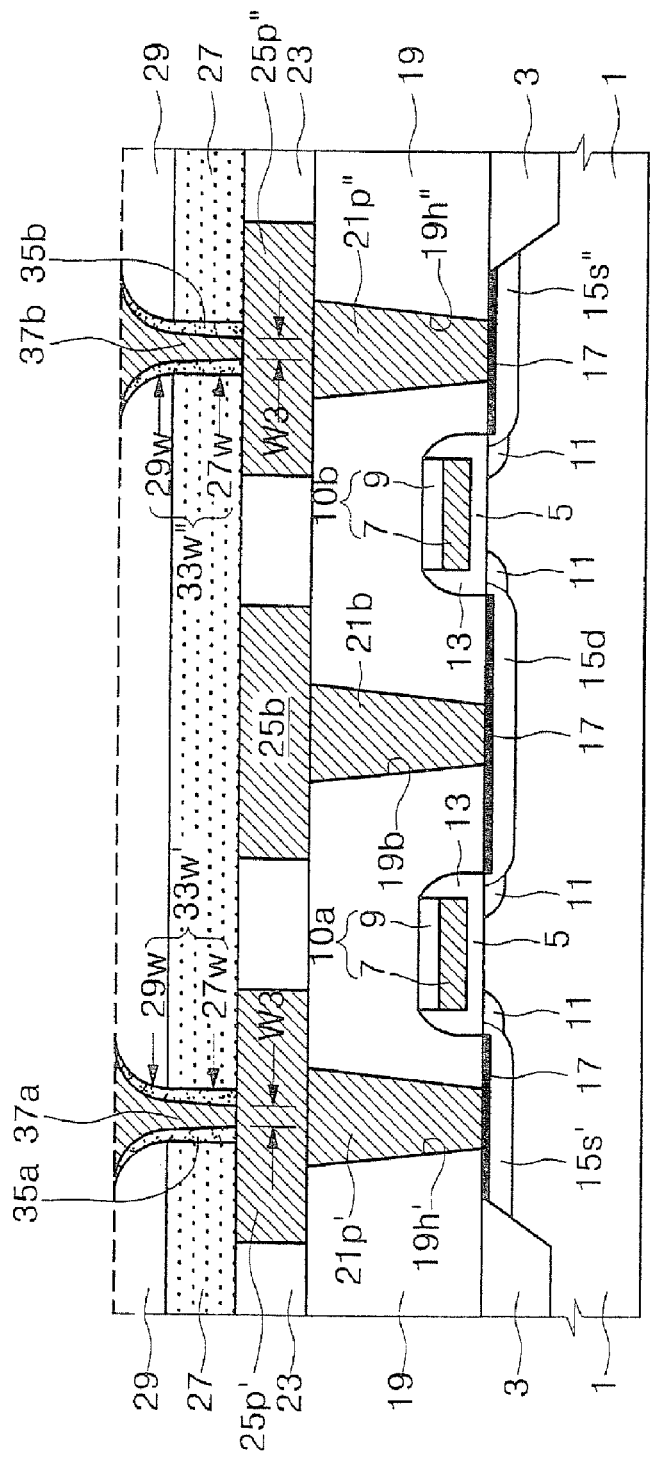

Referring to FIG. 11, a conductive material, such as titanium nitride, is deposited on the sacrificial layer and into the openings 33h', 33h", and a first CMP operation is performed to remove portions of the conductive layer and expose the sacrificial layer 29, thus forming conductive small contact plugs 37a, 37b in the openings 33h', 33h". The sacrificial layer 29 is then removed by etching (e.g., dry etching) to expose the dielectric layer 27. For the illustrated embodiments, a dry etching using an isotropic process is preferable. The etching leaves portions of the plugs 37a, 37b and the sidewall spacers 35a, 35b protruding from the dielectric layer 27. Polymer residue present on the surface of the dielectric layer 27 may be removed by ashing with an oxygen plasma, and cleaning with an HF solution.

Figure 12:
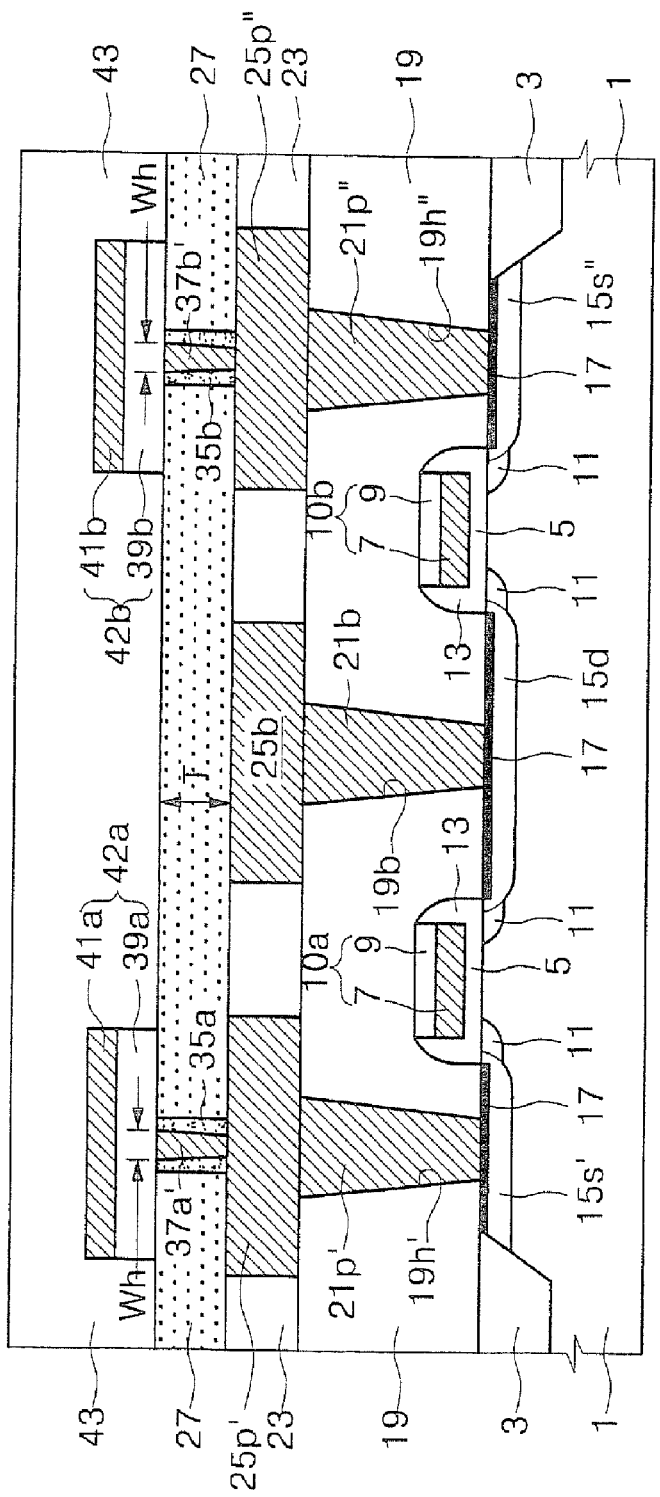

Referring to FIG. 12, the protruding portions of the plugs 37a, 37b and the sidewall spacers 35a, 35b may then be removed with a second CMP operation to produce reduced-size small contact plugs 37a', 37b'. Through the use of the sacrificial layer 29 to reduce the flaring of the contact hole and a contact formation process that involves two CMP steps with an intermediate etching, the plugs 37a', 37b' may have a desirable and more uniform narrowness Wh. Phase-changeable material regions 39a, 39b, upper electrodes 41a, 41b and interlayer dielectric layer 43 may be formed on the plugs 37a', 37b' using conventional processes.

The present invention may provide many advantages. In the illustrated phase-change memory fabrication described above, small contact plugs may be more precisely and uniformly fabricated. In addition, the use of a two-CMP process with intermediate etching can improve planarity by reducing effects such as edge over-erosion. Thus, for example, even though an addition CMP process is performed, reduction in edge over-erosion can allow subsequent planarization steps to be avoided. In other applications, the use of sacrificial layers and/or a multi-CMP process as described above can allow other structures, such as wiring patterns, contacts or vias, to be more precisely fabricated, and can also maintain planarity for photolithographic alignment and other purposes.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A phase-change memory device, comprising:
   a microelectronic substrate including a first conductive region;
   a silicon nitride layer and/or a silicon oxynitride layer on the first conductive region;
   a contact plug extending from a surface of the silicon nitride layer and/or a silicon oxynitride layer through an opening therein to the first conductive region;
   a phase changeable material region on the contact plug and the silicon nitride layer and/or a silicon oxynitride layer; and
   a second conductive region on the phase changeable material region.

2. A device according to claim 1, further comprising a sidewall spacer in the opening in the silicon nitride layer and/or a silicon oxynitride layer.

3. A device according to claim 2, wherein the sidewall spacer comprises silicon nitride.

4. A device according to claim 1, wherein the contact plug comprises tungsten.

5. A semiconductor memory device, comprising:
   a microelectronic substrate including a first conductive region;
   a silicon nitride layer and/or a silicon oxynitride layer on the first conductive region;
   a contact plug extending from a surface of the silicon nitride layer and/or a silicon oxynitride layer through an opening therein to the first conductive region;

a phase changeable material region on the contact plug and the silicon nitride layer and/or a silicon oxynitride layer; and a second conductive region on the phase changeable material region.

6. A device according to claim 5, further comprising a sidewall spacer in the opening in the silicon nitride layer and/or a silicon oxynitride layer.

7. A device according to claim 6, wherein the sidewall spacer comprises silicon nitride.

8. A device according to claim 5, wherein the contact plug comprises a metal-containing material.

9. A semiconductor memory device including a phase changeable material, comprising:

a semiconductor substrate;

an interlayer dielectric layer formed on the substrate;

a first conductive region formed in the interlayer dielectric layer;

a silicon nitride layer and/or a silicon oxynitride layer on the first conductive region and the interlayer dielectric layer;

a contact plug extending from a surface of the silicon nitride layer and/or silicon oxynitride layer through an opening therein to a portion of the first conductive region;

a phase changeable material region on the contact plug and the silicon nitride layer and/or silicon oxynitride layer; and a second conductive region on the phase changeable material region.

10. A device according to claim 9, further comprising a sidewall spacer in the opening in the silicon nitride layer and/or silicon oxynitride layer.

11. A device according to claim 10, wherein the sidewall spacer comprises silicon nitride.

12. A device according to claim 9, wherein the contact plug comprises a metal containing material.

* * * * *